United States Patent
Zuschlag

(10) Patent No.: US 11,977,108 B2
(45) Date of Patent: May 7, 2024

(54) MONITORING SET-UP TO DETECT SUPPLY-LINE FAULTS FOR A CONTROL UNIT

(71) Applicant: Robert Bosch GmbH, Stuttgart (DE)

(72) Inventor: Rainer Zuschlag, Ludwigsburg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 183 days.

(21) Appl. No.: 17/769,828

(22) PCT Filed: Oct. 5, 2020

(86) PCT No.: PCT/EP2020/077804
§ 371 (c)(1),
(2) Date: Apr. 18, 2022

(87) PCT Pub. No.: WO2021/089257
PCT Pub. Date: May 14, 2021

(65) Prior Publication Data
US 2022/0381810 A1 Dec. 1, 2022

(30) Foreign Application Priority Data
Nov. 6, 2019 (DE) ..................... 10 2019 217 083.8

(51) Int. Cl.
*G01R 31/00* (2006.01)
*G01R 15/18* (2006.01)
*G01R 19/00* (2006.01)

(52) U.S. Cl.
CPC ........... *G01R 31/006* (2013.01); *G01R 15/18* (2013.01); *G01R 19/0092* (2013.01)

(58) Field of Classification Search
CPC .. G01R 31/006; G01R 15/18; G01R 19/0092; G01R 31/54; G01R 15/181; G01R 31/58
(Continued)

(56) References Cited

U.S. PATENT DOCUMENTS 11,041,915 B2 * 6/2021 Rumrill ............ G01R 19/16528
11,280,849 B2 * 3/2022 Fallet ..................... G01R 27/26
(Continued)

FOREIGN PATENT DOCUMENTS

| DE | 102010001335 A1 | 8/2010 |
| EP | 0644429 A2 | 3/1995 |
| JP | 2010223907 A | 10/2010 |

OTHER PUBLICATIONS

International Search Report for PCT/EP2020/077804, dated Feb. 1, 2021.

*Primary Examiner* — Giovanni Astacio-Oquendo
(74) *Attorney, Agent, or Firm* — NORTON ROSE FULBRIGHT US LLP; Gerard A. Messina

(57) ABSTRACT

A monitoring set-up to detect supply-line faults for a control unit, including at least two internal current-carrying supply lines, which are redundant with respect to each other, are situated inside of the control unit, and are connected electrically, on one end, to external supply lines, respectively, and, on the other end, to a common, internal supply-potential layer of the control unit; a signal detector, which inductively picks up a flow of current through the individual internal supply lines and outputs at least one corresponding measuring signal; and an evaluation and control unit, which evaluates the at least one measuring signal to detect supply-line faults. A method of detecting supply-line faults for a control unit, using such a monitoring set-up, is also described.

18 Claims, 3 Drawing Sheets

(58) Field of Classification Search
USPC .................. 324/503, 500, 508, 509, 512
See application file for complete search history.

(56) References Cited

U.S. PATENT DOCUMENTS

| | | | | |
|---|---|---|---|---|
| 2015/0008933 A1* | 1/2015 | Zuschlag | ............ | B60R 21/0173 |
| | | | | 324/503 |
| 2015/0115742 A1* | 4/2015 | Willis | .................... | H02H 1/003 |
| | | | | 324/537 |
| 2015/0137828 A1* | 5/2015 | Schmauss | .............. | G01R 31/50 |
| | | | | 324/551 |
| 2018/0292446 A1* | 10/2018 | Hackl | ................ | G01R 31/1272 |

* cited by examiner

MONITORING SET-UP TO DETECT SUPPLY-LINE FAULTS FOR A CONTROL UNIT

FIELD

The present invention relates to a monitoring set-up to detect supply-line faults for a control unit. The present invention also includes a method to detect supply-line faults for a control unit.

BACKGROUND INFORMATION

Control units, such as airbag control units, which have a redundant, grounded power supply, are available in the related art. This redundancy also allows further interference-free operation of the control units, even if one of the grounding lines constructed to be redundant is no longer available due to a defect, such as a broken wire, oxidized contact in the plug connector, etc. Initially, such a defect does not have an effect on the functioning of the control units, since at least one further grounding line is still already there as a redundancy. However, in the ideal case, no and/or only very few undiscovered (dormant) faults should be able to occur, in particular, in control units having a high ASIL rating (ASIL: automotive safety integrity level). Thus, there are standards regarding the maximum impedance of the individual grounding lines, which are supposed to prevent the ground potentials of the individual control units from differing overly markedly from each other. Even the communication between the individual control units is susceptible to such a shift in the ground potential referred to as a ground shift. In addition, there are EMC/ESD standards, which may only be satisfied when the control units are connected highly effectively to ground. For the grounding lines constructed redundantly, monitoring for an elevated impedance, which has increased to the point of possible breaking of one of the grounding lines, is a particular challenge. The low impedance called for is, after all, still given by the redundant grounding line. For this reason, a normal resistance measurement between the ground potential of the vehicle voltage supply, typically a negative pole of the vehicle battery, and the ground potential of the individual control units, proves a failure in this case.

An electronic device, which has a generic monitoring set-up for detecting supply-line faults and includes at least one redundant, current-carrying supply line that is situated outside of the device and supplies the device with power at least partially or completely, is described in German Patent Application No. DE 10 2010 001 335 A1; the externally situated, redundant supply line being electrically connected, in each instance, to inner conductors, such as circuit traces, situated inside of the device. The inner conductors run adjacently to each other in a region; at least one magnetic field detector unit, by which a static and/or time-dependent magnetic field is measurable, being situated adjacently to the inner conductors, in particular, between the inner conductors. A supply-line fault detection circuit, which extracts a fault signal from the signal obtained by the magnetic field detector unit, is present in the monitoring set-up; a fault in the supply line being able to be ascertained, using the fault signal. In the simplest case, the magnetic field detector unit is preferably a magnetic coil, which includes a coil core made of a material having high permeability, in order to increase, in particular, the signal strength. The coil core is made of, for example, a ferromagnetic material. The number of turns per unit of length of the magnetic coil is designed to be so high, that a measuring sensitivity is obtained, which is as high as possible in relation to the available space. The magnetic coil typically has a wound core, which is constructed in such a manner, that it is possible to mount it compactly on a circuit board. Thus, for example, the coil may include a yarnreel-type wound core, which has only a short cylindrical section.

SUMMARY

An advantage of the monitoring set-up to detect supply-line faults for a control unit, in accordance with the present invention, and of the method to detect supply-line faults for a control unit, in accordance with the present invention, may be that it is possible to detect an elevated impedance in one of the redundantly constructed supply lines, by analyzing and evaluating the current distribution in the specific supply lines. To this end, a high-frequency portion of the reverse current of the control unit is transmitted inductively on the redundant supply lines, to an evaluation and control unit. In order to improve the signal quality, a signal conditioner may be connected in incoming circuit to the evaluation and control circuit. The control unit is supplied with current from a d.c. voltage source, typically, from a battery. In the case of hybrid vehicles or fully electric vehicles, the use of a d.c.-d.c. power converter unit for providing the necessary d.c. voltage is also possible. This current flows from a positive pole through the circuit of the control unit, back to the negative pole of the d.c. voltage source. Due to different switching operations in the control unit, the flow of current from the positive pole, in the control unit ECU, is not constant. These switching operations in the control unit may be brought about by d.c. converters in the control unit, as well as by switching operations of a processing unit, sensors, actuators, etc., as well as by internal communication in the control unit via communications buses (SPI, address and data buses of the memory, etc.), as well as by external communication with other control units over vehicle bus systems, such as CAN, FlexRay, Ethernet, etc. In the case of control units having redundant supply lines, this high-frequency, dynamic current consumption of the control unit generated by internal switching operations is utilized to detect supply-line faults, in order to discover the defective supply line having a significantly higher impedance.

Specific example embodiments of the present invention provide a monitoring set-up to detect supply-line faults for a control unit, including at least two internal current-carrying supply lines, which are redundant with respect to each other, are situated inside of the control unit, and are connected electrically, on one end, to, in each instance, an external supply line, and, on the other end, to a common internal supply-potential layer of the control unit; a signal detector, which inductively picks up a flow of current through the individual, internal supply lines and outputs at least one corresponding measuring signal; and an evaluation and control unit, which evaluates the at least one measuring signal to detect supply-line faults. In this connection, in front of the point of electrical connection with the common internal supply-potential layer, the two internal supply lines each form a planar supply-line coil having at least one winding; for each of the supply-line coils, the signal detector including at least one planar sensor coil, each of which is assigned to one of the supply line coils, and which picks up a high-frequency, dynamic flow of current through the corresponding supply-line coil, caused by internal switching operations.

In addition, a method is provided to detect supply-line faults for a control unit, which may be carried out by such a monitoring set-up. In this connection, inside of the control unit, in each instance, a flow of current in at least two internal, current-carrying supply lines, which are redundant with respect to each other, and are connected, on one end, to, in each instance, an external supply line, and, on the other end, to a common supply-potential layer, is picked up inductively; the acquired current signals being compared to each other and evaluated. In this connection, a high-frequency, dynamic current through the at least two internal supply lines into at least two planar supply-line coils, which form the internal supply lines, in each instance, in front of the point of electrical connection with common internal supply-potential layer, is measured, in each instance, as a current flow, by at least one planar sensor coil, which is assigned to the corresponding planar supply-line coil.

In the normal case, in which equally effective supply connections are present in the at least two redundant supply lines, a supply current of the control unit is distributed uniformly over the redundant supply lines present. The evaluation and control unit evaluates the difference between the redundant supply lines. In the case of an approximately uniform distribution of the currents over the redundant supply lines, the difference is very small, that is, approaches zero. For the case in which the impedance in one of the redundant supply lines has increased significantly, for example, due to a break of a wire, an oxidized contact in the plug connector, etc., the current is now distributed only asymmetrically over the redundant supply lines, that is, only flows through the remaining supply line(s). The evaluation and control unit now detects a significant difference between the redundant supply lines and may make the conditioned and filtered signal available to a microcontroller or microprocessor or a processing unit in an analog or even digital form, for further processing. In addition, the evaluation and control unit may even be implemented as part of the microcontroller or microprocessor or the processing unit. A corresponding application and/or function in the processing unit may then undertake further steps for the information of the driver, that is, store a fault in the fault storage device.

Presently, the evaluation and control unit may be understood as an electrical circuit, which processes and/or evaluates acquired sensor signals. The evaluation and control unit may include at least one interface, which may take the form of hardware and/or software. In a hardware design, the interfaces may be, for example, part of a so-called system ASIC that includes many different functions of the evaluation and control unit. However, it is also possible for the interfaces to be separate, integrated circuits or to be at least partially made up of discrete components. In a software design, the interfaces may be software modules that are present, for example, in a microcontroller, next to other software modules. Additionally advantageous, is a computer program product having program code, which is stored in a machine-readable carrier, such as a solid-state memory, a hard-disk memory or an optical memory, and is used to perform the evaluation when the program is executed by the evaluation and control unit.

A supply line is presently understood as a grounding line or a voltage supply line, which makes a suitable electrical potential available to the control unit. Thus, for example, a redundant, grounded power supply of the control unit may be implemented, using at least two redundant grounding lines. In the control unit, the corresponding, redundant, internal grounding lines may be brought together at a common ground potential layer. Accordingly, a redundant voltage supply may be implemented via at least two redundant voltage supply lines. In the control unit, the corresponding, redundant, internal voltage supply lines may be brought together at a common electrical potential layer.

The measures and further refinements of the present invention disclosed herein allow advantageous improvements of the monitoring set-up to detect supply-line faults for a control unit, and to the method of detecting supply-line faults for a control unit.

In accordance with an example embodiment of the present invention, it is particularly advantageous that the at least two planar supply-line coils may be constructed identically. In addition, the at least two planar sensor coils may be constructed identically so as to have a greater number of turns than the at least two supply-line coils. In order to keep the influence on the common electrical potential layer in the control unit, and on the supply lines in the vehicle, to a minimum, the high-frequency, dynamic flow of current, which is generated by internal switching operations and has accumulated on the common electrical potential layer from all of the circuit elements, is now directed through identical planar supply-conductor coils to the redundant internal supply lines. The planar supply-conductor coils have relatively few "windings" that include wide circuit traces, in order to fulfill the power demands of the control unit. The high-frequency, dynamic current flow generated by internal switching operations induces a small electromagnetic field in the planar supply-conductor coils. This electromagnetic field may now be picked up by one or more planar sensor coils and supplied to the evaluation and control unit. In the normal case, the planar sensor coils include considerably more "windings" that have narrower circuit traces than the planar supply conductor coils, in order to render the specific planar sensor coil more sensitive to the small electromagnetic field induced. The planar supply-conductor coils and/or the planar sensor coils may have various shapes, including circular, oval, square, rectangular, symmetrically polygonal, as well as asymmetrically polygonal, as a function of the space available on the circuit board. In all of the angular variants, the changes in direction of the circuit trace may be accomplished, using beveled or rounded-off circuit-trace routing.

In an advantageous refinement of the monitoring device of the present invention, the at least two planar supply-line coils may each be situated in a first circuit-board layer of a multilayered circuit board, and the at least one associated planar sensor coil may be situated in a second circuit-board layer above or below the first circuit board layer. Thus, the at least two planar supply-line coils may be situated, for example, next to each other in the same, first circuit-board layer, and the planar sensor coil assigned to the planar supply-line coils may be situated next to each other in a second circuit-board layer above or below the first circuit-board layer. This means that the circuit board is preferably implemented as a multilayered, printed circuit board (PCB). Alternatively, the planar sensor coils and the planar supply line coils may each be situated in different circuit-board layers. This means, for example, that two planar supply-line coils and the two associated sensor coils are positioned as a stack in four circuit-board layers.

In a further advantageous refinement of the monitoring set-up of the present invention, the at least one associated planar sensor coil may cover the corresponding planar supply-line coil at least regionally, preferably, completely. Ideally, the planar sensor coils lie coincidentally over and/or between the planar supply-line coils in a different circuit-board layer, in order to maximize the coupling factor between the planar supply-conductor coils and the planar sensor coils.

In a further advantageous refinement of the monitoring set-up of the present invention, a signal conditioner, which may condition the at least one acquired measuring signal, may be looped in between the signal detector and the evaluation and control unit. In this manner, the signal quality may be improved prior to the evaluation. The signal conditioner may include, for example, a rectifier and/or a filter and/or an amplifier. The voltage induced in the planar sensor coils may be conditioned by the signal conditioner in the form of a signal. Thus, after optional rectification and filtering, the measuring signal that is still small may be amplified. A plurality of stages from operational amplifiers or an instrumentation amplifier having low noise may be used as an amplifier. The measuring signal conditioned in this manner may now be supplied to an analog-to-digital converter for more complex evaluation, and processed further in the processing unit. Alternatively, a simple evaluation may be carried out, using a comparator circuit.

In one advantageous refinement of the method of the present invention to detect supply-line faults for a control unit, a supply-line fault is not detected, if a current distribution in the at least two supply-line coils is identical within a predefined tolerance window, and otherwise, a supply-line fault is detected. In addition, different accuracy classes may be specified for the detected supply-line faults, using different tolerance windows. Different stages and accuracy classes of detection of supply-line from simple to complex are possible as a function of utilized topology and positioning of the planar supply-conductor coils in the internal supply paths, the number and/or configuration of the planar sensor coils, the winding sense between the planar supply-conductor coils among each other, as well as with respect to the planar sensor coils, and the complexity of the evaluation and control unit.

In the case of simple line-fault detection, a significantly elevated impedance of one of the redundant supply lines may be detected, without making an assertion as to which of the supply lines is involved. In addition, a statement regarding the remaining quality of the supply line may not be made. In more complex line-fault detection, a statement may be made as to which of the redundant supply lines has an elevated impedance. In addition, classification of the redundant supply lines into different fault classes may be undertaken. Thus, the redundant supply lines may be classified as faultless, if the differences in impedance lie within a narrow tolerance window. In the case of a slightly elevated impedance difference, which lies in a further, but still acceptable tolerance window, the fault may be stored internally, but no driver information item may be outputted. The fault stored internally may then be read out via a diagnostic interface during the next visit to a garage. In the event of a significantly elevated difference in impedance, which lies outside of the tolerance window still acceptable, the fault may be stored internally, and a suitable driver information item may be outputted, for example, using a warning light or a multifunctional display. In response to a broken supply line and a maximum difference in impedance, the fault may be stored internally, and an appropriate driver information item may be outputted, for example, via a warning light or a multifunctional display. Consequently, scaling and optimization, which are geared to customer demand and are in regard to circuit board area, number of utilized components of the evaluation and control unit, and therefore, costs, as well, may be achieved.

Exemplary embodiments of the present invention are depicted in the figures and are explained in greater detail in the following description. In the figures, identical reference characters denote components and/or elements, which perform the same or analogous functions.

DETAILED DESCRIPTION OF EXAMPLE EMBODIMENTS

As is shown in FIG. 1 through 4, the shown exemplary embodiments of a monitoring set-up 10 of the present invention to detect supply-line faults for a control unit 1 include, in each instance, at least two internal current-carrying supply lines LB1, LB2, which are redundant with respect to each other, are situated within control unit 1, and are connected electrically, on one end, to external supply lines L1_GND, L2_GND, respectively, and, on the other end, to a common, internal supply-potential layer C_GND of control unit 1; a signal detector 12, which inductively picks up a flow of current through internal supply lines LB1, LB2 and outputs at least one corresponding measuring signal; and an evaluation and control unit 16, which evaluates the at least one measuring signal to detect supply-line faults. In this connection, in front of the point of electrical connection with common, internal supply-potential layer C_GND of control unit 1, the two internal supply lines LB1, LB2 form planar supply-line coils LG1, LG2, respectively, which each have at least one winding. For each of planar supply-line coils LG1, LG2, signal detector 12 includes at least one planar sensor coil LS1, LS2, each of which is assigned to one of supply-line coils LG1, LG2, respectively, and which picks up a high-frequency, dynamic flow of current through corresponding supply-line coil LG1, LG2, caused by internal switching operations.

Figure 1:
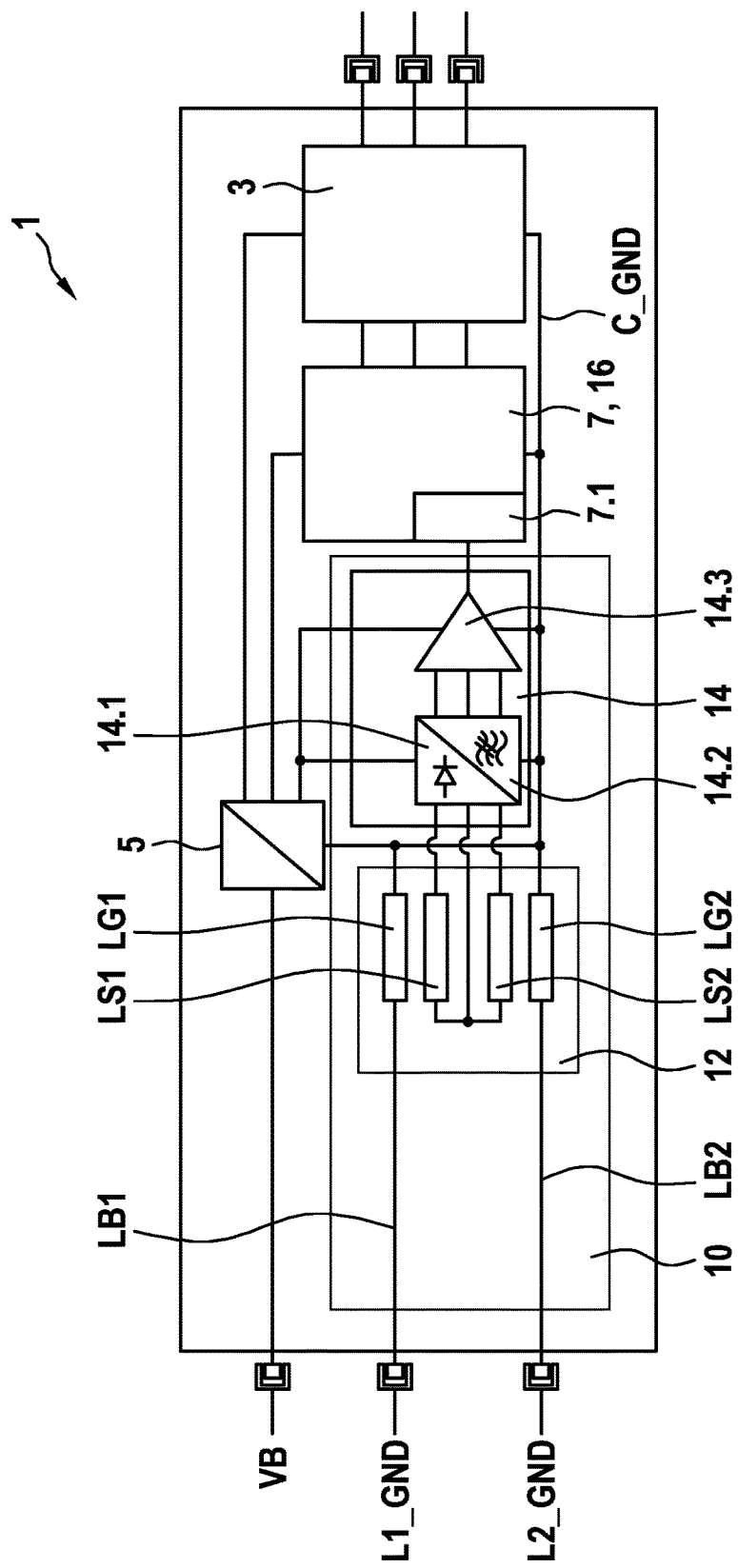
FIG. 1 shows a schematic representation of a control unit including an exemplary embodiment of a monitoring set-up of the present invention to detect supply-line faults for a control unit, in accordance with the present invention.

As is further shown FIG. 1, in the exemplary embodiment shown, control unit 1 includes a redundant, grounded power supply having two internal, current-carrying supply lines LB1, LB2, which are redundant with respect to each other, are situated inside of control unit 1, and are connected, on one end, to external supply lines L1_GND, L2_GND, respectively. In addition, a further supply line not denoted in more detail supplies control unit 1 with an electrical-system voltage VB of the corresponding vehicle. In the exemplary embodiment shown, control unit 1 also includes a d.c. voltage converter 5, which generates different internal voltages for a processing unit 7 and a communications unit 3 of control unit 1, from electrical-system voltage VB. In the exemplary embodiment shown, processing unit 7 includes an analog-to-digital converter 7.1, which converts an analog measuring signal of monitoring circuit 10 to a digital signal. In addition, processing unit 7 takes on the function of evaluating and control unit 16 of monitoring set-up 10 and evaluates the measuring signal to detect a supply-line fault. As is further shown in FIG. 1, the monitoring set-up 10 shown includes a signal conditioner 14, which is looped in between signal detector 12 and evaluating and control unit 16 and conditions the at least one acquired measuring signal. To this end, in the exemplary embodiment shown, signal conditioner 14 includes a rectifier 14.1, a filter 14.2, and an amplifier 14.3. Signal conditioner 14 receives the two acquired current signals and generates a differential signal as a measuring signal, which is evaluated further and classified by downstream evaluation and control unit 16.

Figure 2:
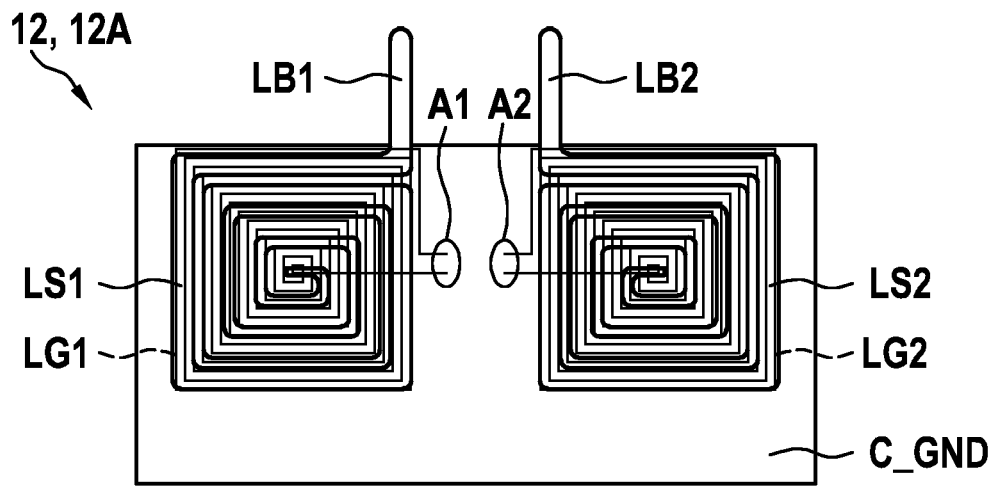
FIG. 2 shows a schematic top view of a first exemplary embodiment in accordance with the present invention of a signal detector for the monitoring set-up from FIG. 1, without a representation of a multilayered circuit board, in which the signal detector is situated.
Figure 3:
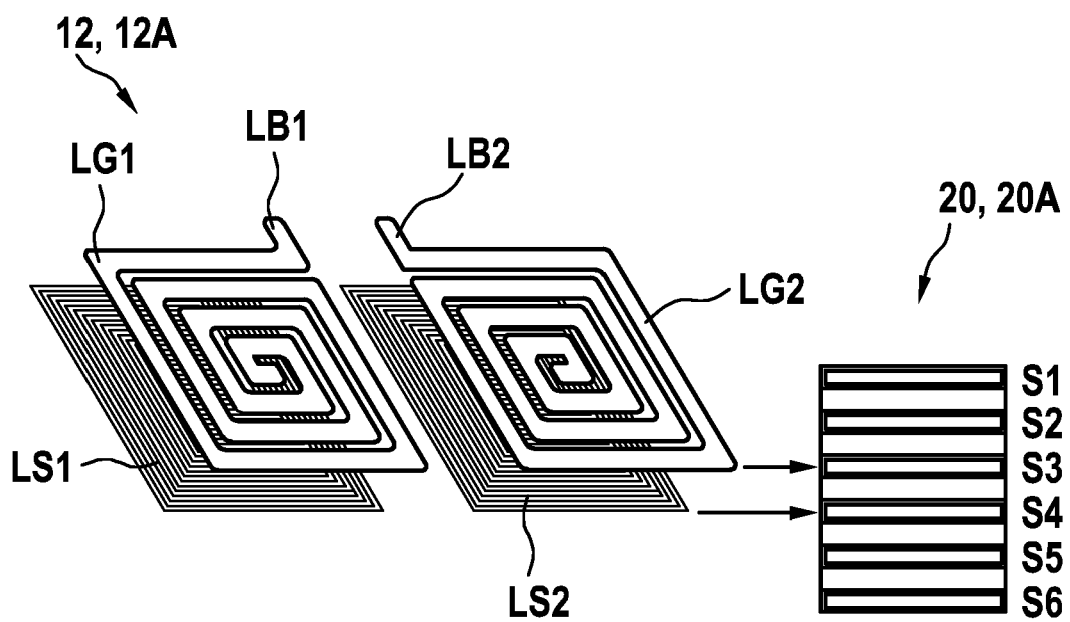
FIG. 3 shows a schematic perspective view of planar supply-conductor coils and planar sensor coils for the signal detector from FIG. 2, and a schematic sectional view of a corresponding multilayered circuit board, in which the signal detector is situated.
Figure 4:
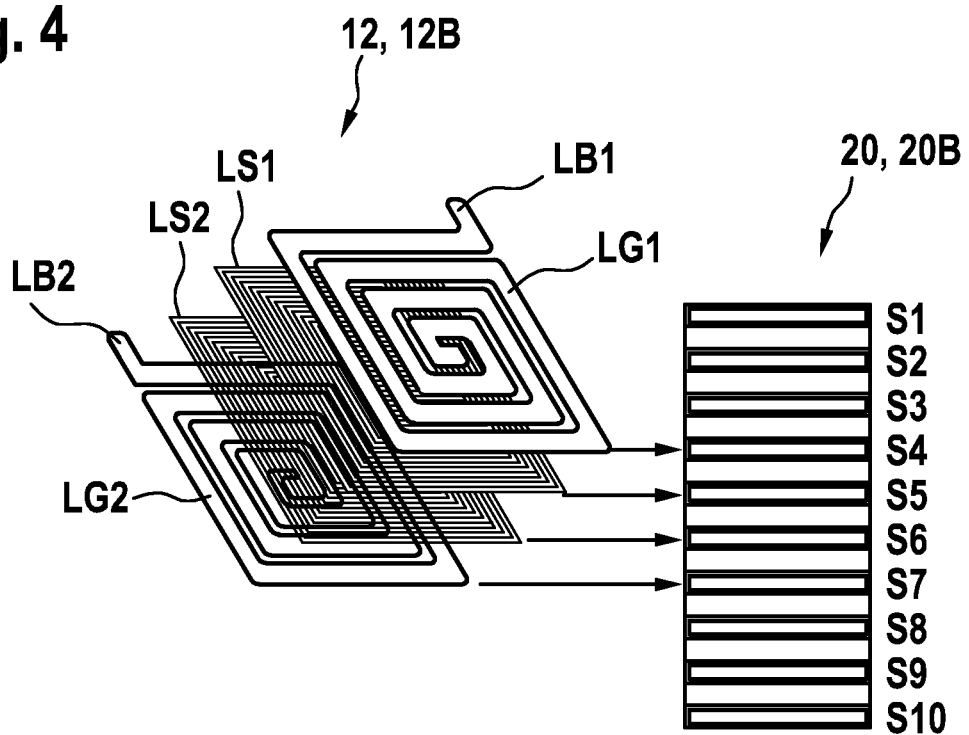
FIG. 4 shows a schematic perspective view of planar supply-conductor coils and planar sensor coils for a second exemplary embodiment of a signal detector in accordance with the present invention, and a schematic sectional view of a corresponding multilayered circuit board, in which the signal detector is situated.

As is shown, in particular, in FIG. 2 through 4, the at least two planar supply-line coils LG1, LG2 are constructed identically. The at least two planar sensor coils LS1, LS2 are also constructed identically, but to have a greater number of turns than the at least two supply-line coils LG1, LG2.

In the exemplary embodiment shown, monitoring set-up 10 includes two internal supply lines LB1, LB2, which each form a planar supply-line coil LG1, LG2. In this connection, planar supply-line coils LG1, LG2 are each assigned a planar sensor coil LS1, LS2.

As is further shown in FIGS. 2 and 3, in the first exemplary embodiment of signal detector 12A shown, the two planar supply-line coils LG1, LG2 are each situated in a third circuit-board layer S3 of a multilayered circuit board 20, which is implemented, in the exemplary embodiment shown, as a multilayered, printed circuit board 20A having six circuit-board layers S1 through S6. The two planar sensor coils LS1, LS2 assigned to supply-line coils LG1, LG2 are each situated in a fourth circuit-board layer S4 below third circuit-board layer S3. In the exemplary embodiment shown, in a first and sixth circuit-board layer S1, S6, other signals are routed in corresponding circuit traces. In the third and fourth circuit-board layers S3, S4, as well, signals other than the coil signals are also routed in corresponding circuit traces. Common electrical potential layer C_GND, in this case, a common grounding layer of control unit 1, is situated in a second circuit-board layer S2. Planar supply-conductor coils LG1, LG2 are connected electrically to common electrical potential layer C_GND in second circuit-board layer S2 via plated-through holes not shown in further detail. A common return path of the two planar sensor coils LS1, LS2 is situated in a fifth circuit-board layer S5 and connected to signal conditioner 14. The corresponding ends of planar sensor coils LS1, LS2 are connected electrically to the return path in fifth circuit-board layer S5 via corresponding plated-through holes or via a common plated-through hole. The other ends of planar sensor coils LS1, LS2 are each connected electrically to signal conditioner 14 via respective circuit traces. In addition, other signals may also be routed in this circuit-board layer S5 via corresponding circuit traces. As is further shown in FIGS. 2 and 3, planar sensor coils LS1, LS2 are positioned in such a manner, that they each cover respective planar supply-line coils LG1, LG2 completely.

As is further shown in FIG. 4, in the second exemplary embodiment of signal detector 12B shown, planar supply-line coils LG1, LG2 and planar supply-line coils LG1, LG2 are each situated in different circuit-board layers S4, S5, S6, S7 of a multilayered circuit board 20B, which is implemented, in the exemplary embodiment shown, as a multi-layered, printed circuit board 20B having ten circuit-board layers S1 through S10. Of course, other specific embodiments of multilayered circuit boards 20, which include more or less than six and/or ten circuit-board layers, may also be used.

As is further shown in FIG. 4, in the second exemplary embodiment of signal detector 12B shown, a first planar supply-line coil LG1 is situated in a fourth circuit-board layer S4. In this case, a first planar sensor coil LS1 assigned to first supply-line coil LG1 is situated in a fifth circuit-board layer S5 below the first supply-conductor coil LG1 in fourth circuit-board layer S4. In the second exemplary embodiment of signal detector 12B shown, a second planar supply-line coil LG2 is situated in a seventh circuit-board layer S7. In this case, a second planar sensor coil LS2 assigned to second supply-line coil LG2 is situated in a sixth circuit-board layer S6 above the second planar supply-line coil LG2 in seventh circuit-board layer S7. Thus, in the second exemplary embodiment of signal detector 12B shown, the two planar sensor coils LS1, LS2 are situated between the two planar supply-conductor coils LG1, LG2. In the exemplary embodiment shown, in a first, second, ninth, and tenth circuit-board layer S1, S2, S9, S10, other signals are routed in corresponding circuit traces. In the fourth through seventh circuit-board layers S4 through S7, as well, signals other than the coil signals are also routed in corresponding circuit traces. The common electrical potential layer C_GND, in this case, a common grounding layer of control unit 1, is situated in a third circuit-board layer S3. Planar supply-conductor coils LG1, LG2 are connected electrically to common electrical potential layer C_GND in third circuit-board layer S3 via plated-through holes not represented in further detail. A common return path of the two planar sensor coils LS1, LS2 is situated in an eighth circuit-board layer S8 and connected to signal conditioner 14. The corresponding ends of planar sensor coils LS1, LS2 are connected electrically to the return path in eighth circuit-board layer S8 via corresponding plated-through holes. The other ends of planar sensor coils LS1, LS2 are each connected electrically to signal conditioner 14 via respective circuit traces. In addition, other signals may also be routed in this circuit-board layer S8 via corresponding circuit traces. As is further shown in FIG. 4, planar sensor coils LS1, LS2 are positioned in such a manner, that they each cover the corresponding planar supply-line coil LG1, LG2 completely.

Figure 5:
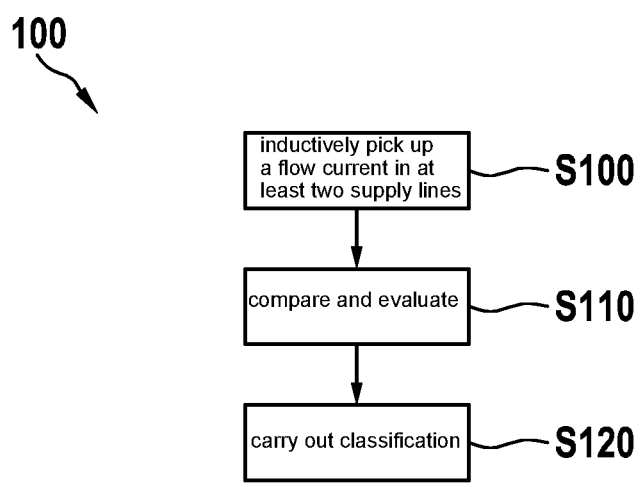
FIG. 5 shows a schematic flow chart of an exemplary embodiment of a method of the present invention to detect supply-line faults for a control unit.

As is further shown in FIG. 5, in a step S100, the shown exemplary embodiment of the method 100 of the present invention to detect supply-line faults for a control unit 1 inductively picks up, in each instance, a flow of current in at least two internal, current-carrying supply lines LB1, LB2, which are redundant with respect to each other and are connected, on one end, to external supply lines L1_GND, L2_GND, respectively, and, on the other end, to a common supply-potential layer C_GND. In this connection, a high-frequency, dynamic current, which is generated by internal switching operations and travels through the at least two internal supply lines LB1, LB2 into at least two planar supply-line coils LG1, LG2 that form the internal supply lines LB1, LB2, in each instance, in front of the point of electrical connection with common, internal supply potential layer C_GND, is picked up, in each instance, as a current flow, by at least one planar sensor coil LS1, LS2, which is assigned to the corresponding planar supply-line coil LG1, LG2. In step S110, the acquired current signals are compared to each other and evaluated. To this end, a differential signal is generated from the acquired current signals and evaluated as a measuring signal. Thus, for example, a supply-line fault is not detected, if a current distribution in the at least two supply-line coils LG1, LG2 is identical, that is, an ascertained current difference lies within a predefined tolerance window. Otherwise, a supply-line fault is detected. In the exemplary embodiment shown, optional classification of the detected supply-line fault is carried out in step S120. Thus, different accuracy classes for the detected supply-line faults are given by different tolerance windows. Different stages and accuracy classes of detection of supply-line faults from simple to complex are possible as a function of utilized topology and positioning of planar supply-conductor coils LG1, LG2 in the internal supply paths, the number and/or configuration of planar sensor coils LS1, LS2, the winding sense between planar supply-conductor coils LG1, LG2 among each other, as well as with respect to the planar sensor coils LS1, LS2, and the complexity of evaluation and control unit 16.

What is claimed is:

1. A monitoring set-up to detect supply-line faults for a control unit, comprising:
    at least two internal current-carrying supply lines, which are redundant with respect to each other, situated inside of the control unit, and connected electrically, on one end, to external supply lines, respectively, and, on the other end, to a common, internal supply-potential layer of the control unit;
    a signal detector, which inductively picks up a flow of current through each of the internal supply lines and outputs at least one corresponding measuring signal; and
    an evaluation and control unit, which evaluates the at least one measuring signal to detect supply-line faults;
    wherein in front of a point of electrical connection with the common internal supply-potential layer of the control unit, the two internal supply lines each form a planar supply-line coils, which each have at least one winding; and for each of the planar supply-line coils, the signal detector includes at least one planar sensor coil, each of which is assigned to one supply coil of the supply-line coils, respectively, and which picks up a high-frequency, dynamic flow of current that is caused by internal switching operations and travels through the supply-line coil.

2. The monitoring set-up as recited in claim 1, wherein the at least two planar supply-line coils are constructed identically, and wherein the at least two planar sensor coils are constructed identically to have a greater number of turns than the at least two supply-line coils.

3. The monitoring set-up as recited in claim 2, wherein the planar sensor coils and the planar supply-line coils are each situated in different circuit-board layers.

4. The monitoring set-up as recited in claim 1, wherein the at least two planar supply-line coils are each situated in a first circuit-board layer of a multilayered circuit board, and the at least one assigned, planar sensor coil is situated in a second circuit-board layer above or below the first circuit-board layer.

5. The monitoring set-up as recited in claim 4, wherein the at least one assigned planar sensor coil covers a corresponding one of the planar supply-line coils at least regionally or completely.

6. The monitoring set-up as recited in claim 1, wherein a signal conditioner, which conditions the at least one acquired measuring signal, is looped between the signal detector and the evaluation and control unit.

7. The monitoring set-up as recited in claim 6, wherein the signal conditioner includes a rectifier and/or a filter and/or an amplifier.

8. The monitoring set-up as recited in claim 1, wherein a supply-line fault is not detected, when a current distribution in the at least two supply-line coils is identical within a predefined tolerance window, and wherein a supply-line fault is detected when the current distribution in the at least two supply-line coils is not identical within the predefined tolerance window.

9. The monitoring set-up as recited in claim 8, wherein different accuracy classes for the detected supply-line faults are given by different tolerance windows.

10. A method of detecting supply-line faults for a control unit, the method comprising:
    acquiring current signals, by inductively picking up, via a signal detector, a flow of current in each of at least two internal current-carrying supply lines, which are inside of the control unit, and which are redundant with respect to each other and are connected, on one end, to, in each instance, an external supply line, and, on the other end, to a common supply-potential layer;
    comparing the acquired current signals to each other and evaluating the acquired current signals, via an evaluation and control unit, which evaluates at least one measuring signal to detect supply-line faults;
    wherein a high-frequency, dynamic current, which is caused by internal switching operations and travels through the at least two internal supply into at least two planar supply-line coils that form the internal supply lines, in each instance, in front of a point of electrical connection with the common internal supply-potential layer, is picked up, in each instance, as a current flow, by at least one planar sensor coil, which is assigned to a corresponding one of the planar supply-line coils.

11. The method as recited in claim 10, wherein a supply-line fault is not detected, when a current distribution in the at least two supply-line coils is identical within a predefined tolerance window, and a supply-line fault is detected when the current distribution in the at least two supply-line coils is not identical within the predefined tolerance window.

12. The method as recited in claim 11, wherein different accuracy classes for the detected supply-line faults are given by different tolerance windows.

13. The method as recited in claim 10, wherein the at least two planar supply-line coils are constructed identically, and the at least two planar sensor coils are constructed identically to have a greater number of turns than the at least two supply-line coils.

14. The method as recited in claim 13, wherein the planar sensor coils and the planar supply-line coils are each situated in different circuit-board layers.

15. The method as recited in claim 10, wherein the at least two planar supply-line coils are each situated in a first circuit-board layer of a multilayered circuit board, and the at least one assigned, planar sensor coil is situated in a second circuit-board layer above or below the first circuit-board layer.

16. The method as recited in claim 15, wherein the at least one assigned planar sensor coil covers a corresponding one of the planar supply-line coils at least regionally.

17. The method as recited in claim 10, wherein a signal conditioner, which conditions the at least one acquired measuring signal, is looped between the signal detector and the evaluation and control unit.

18. The method as recited in claim 17, wherein the signal conditioner includes a rectifier and/or a filter and/or an amplifier.

\* \* \* \* \*